US012390009B2

(12) United States Patent
Chen et al.

(10) Patent No.: US 12,390,009 B2
(45) Date of Patent: Aug. 19, 2025

(54) SLIDE RAIL MECHANISM

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Wei-Chen Chang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 172 days.

(21) Appl. No.: 18/382,052

(22) Filed: Oct. 19, 2023

(65) Prior Publication Data
US 2025/0009127 A1    Jan. 9, 2025

(30) Foreign Application Priority Data

Jul. 5, 2023   (TW) .................... 112125380

(51) Int. Cl.
A47B 88/49      (2017.01)
A47B 88/43      (2017.01)
A47B 88/493     (2017.01)
F16C 29/04      (2006.01)

(52) U.S. Cl.
CPC ............ A47B 88/493 (2017.01); A47B 88/43 (2017.01); F16C 29/04 (2013.01); A47B 2210/0045 (2013.01)

(58) Field of Classification Search
CPC ..... A47B 88/43; A47B 88/437; A47B 88/443; A47B 88/493; A47B 2210/0043; A47B 2210/0045; F16C 29/04; F16C 2314/72
See application file for complete search history.

(56) References Cited

U.S. PATENT DOCUMENTS

| 6,257,683 | B1 * | 7/2001 | Yang ................. A47B 88/487 312/334.46 |
| 8,147,011 | B2 | 4/2012 | Chen |
| 2006/0120636 | A1 * | 6/2006 | Chen ................. A47B 88/40 384/18 |
| 2013/0334766 | A1 * | 12/2013 | Okamoto ........... B65H 1/00 271/145 |
| 2020/0337462 | A1 | 10/2020 | Chen |
| 2022/0039552 | A1 * | 2/2022 | Moscoso ........... A47B 88/487 |
| 2023/0099003 | A1 | 3/2023 | Chen |

FOREIGN PATENT DOCUMENTS

| JP | 2013-255678 | 12/2013 |
| JP | 2022-188731 | 12/2022 |
| JP | 2023-50063  | 4/2023 |

* cited by examiner

Primary Examiner — Phillip A Johnson
(74) Attorney, Agent, or Firm — Winston Hsu

(57) ABSTRACT

A slide rail mechanism is provided and includes a supporting member, a slide rail assembly and a rolling member. The slide rail assembly and the supporting member are displaceable relative to each other. The rolling member is arranged on one of the slide rail assembly and the supporting member. The slide rail assembly is configured to engage with the supporting member via the rolling member.

18 Claims, 16 Drawing Sheets

SLIDE RAIL MECHANISM

BACKGROUND OF THE INVENTION

1. Field of the Invention

The present invention relates to a slide rail product, and more specifically, to a slide rail mechanism with a low frictional force.

2. Description of the Prior Art

For example, in U.S. Pat. No. 8,147,011 B2, it discloses a slide rail assembly including a first rail, a second rail and a third rail. The second rail is movably mounted between the first rail and the third rail. The second rail includes a first segment and a second segment. The first segment and the second segment are connected to each other back to back. A plurality of first rollers and a plurality of second rollers are arranged on the second segment. When the third rail is pulled out relative to the second rail, the plurality of first rollers and the plurality of second rollers can support the third rail for facilitating a movement of the third rail. When the third rail is pulled out relative to the second rail at a predetermined distance, a support roller connected to a front support of the first rail also can support the third rail. The support roller is further configured to support the third rail for facilitating an inserting movement of the third rail during reinsertion of the third rail into the second rail after the third rail is completely pulled out of the second rail.

However, in order to meet various requirements, it becomes an important topic to provide an improved slide rail product.

SUMMARY OF THE INVENTION

It is an objective of the present invention to provide a slide rail mechanism with a low frictional force.

According to an aspect of the present invention, a slide rail mechanism includes a first supporting member, a slide rail assembly and at least one rolling member. A length of the slide rail assembly is different from a length of the first supporting member, and the slide rail assembly includes a first rail. The first rail and the first supporting member are displaceable relative to each other by the at least one rolling member.

According to another aspect of the present invention, a slide rail mechanism includes a first supporting member, a slide rail assembly and a rolling member. The first supporting member includes a first wall and a second wall. The slide rail assembly includes a first rail. The first rail and the first supporting member are displaceable relative to each other along a longitudinal direction. The rolling member is arranged on one of the first rail and the first supporting member and rotatably contacting with another one of the first rail and the first supporting member, so as to engage the first rail with the first wall of the first supporting member via the rolling member.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "left", "right", "front", "back", etc., is used with reference to the orientation of the Figure(s) being described. The members of the present invention can be positioned in a number of different orientations. As such, the directional terminology is used for purposes of illustration and is in no way limiting. Accordingly, the drawings and descriptions will be regarded as illustrative in nature and not as restrictive. Also, if not specified, the term "connect" is intended to mean either an indirect or direct mechanical connection. Thus, if a first device is connected to a second device, that connection may be through a direct mechanical connection, or through an indirect mechanical connection via other devices and connections.

Figure 1:
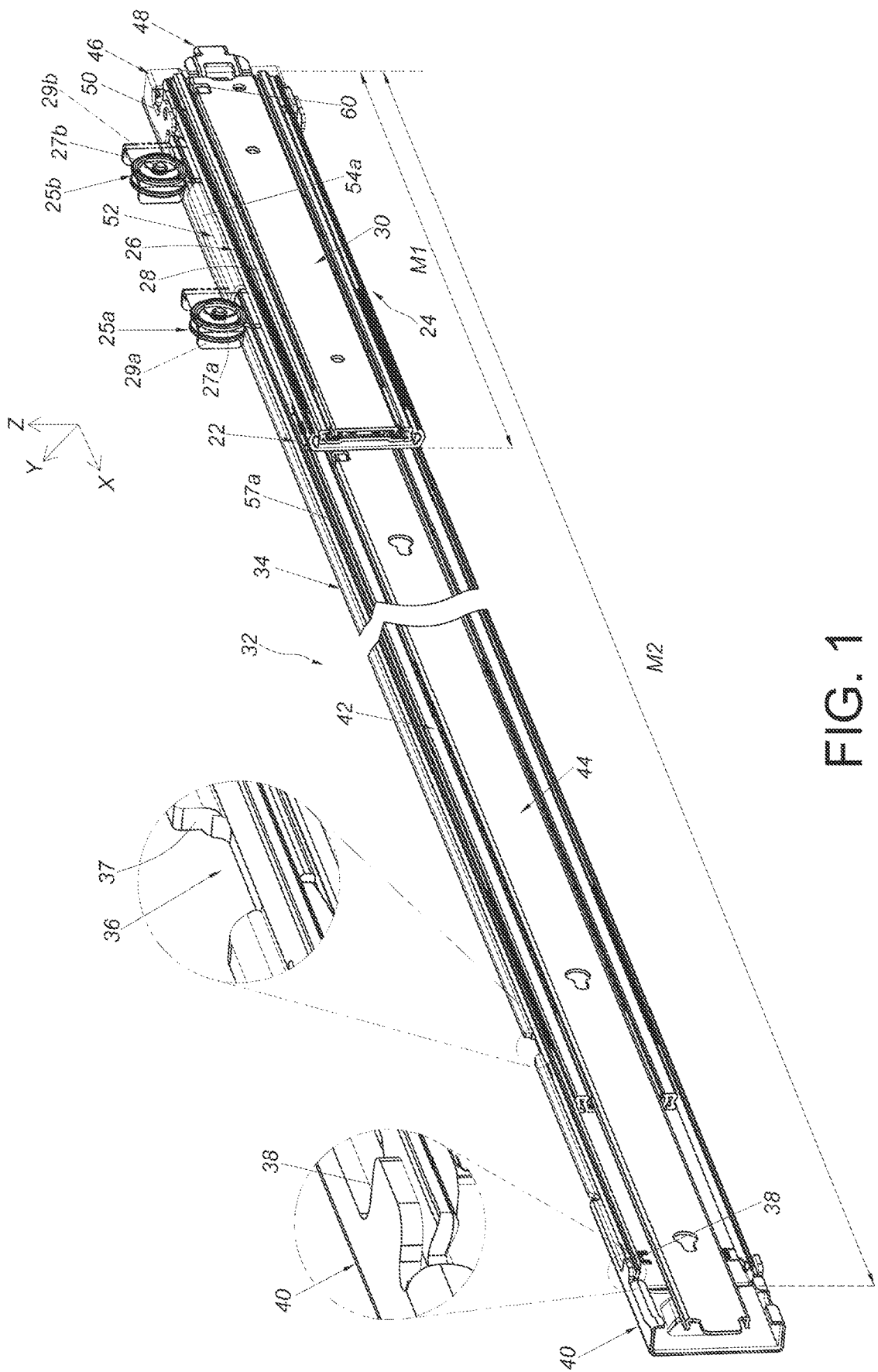
FIG. 1 is a schematic diagram of a slide rail mechanism according to an embodiment of the present invention.
Figure 2:
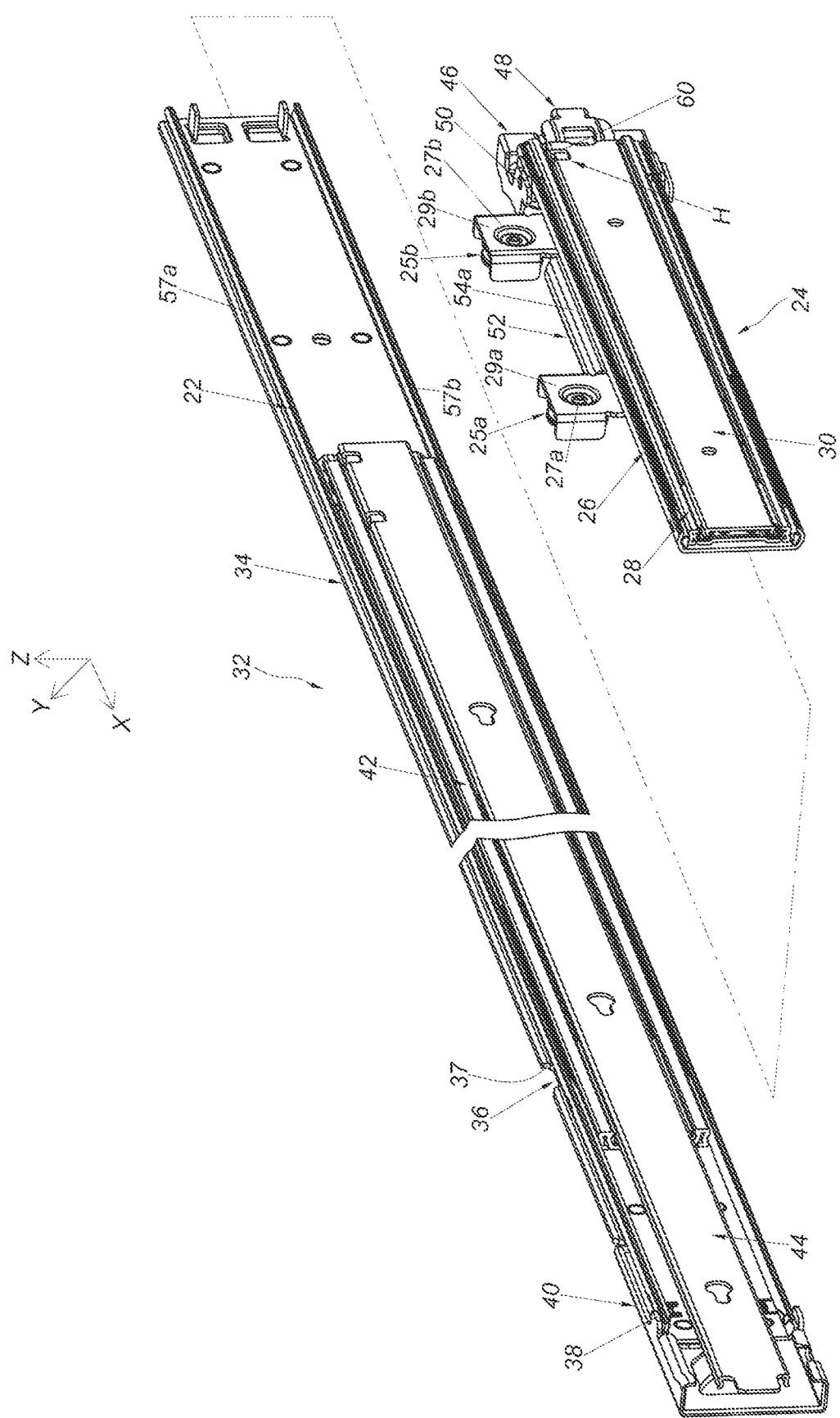
FIG. 2 is an exploded diagram of the slide rail mechanism according to the embodiment of the present invention.
Figure 3:
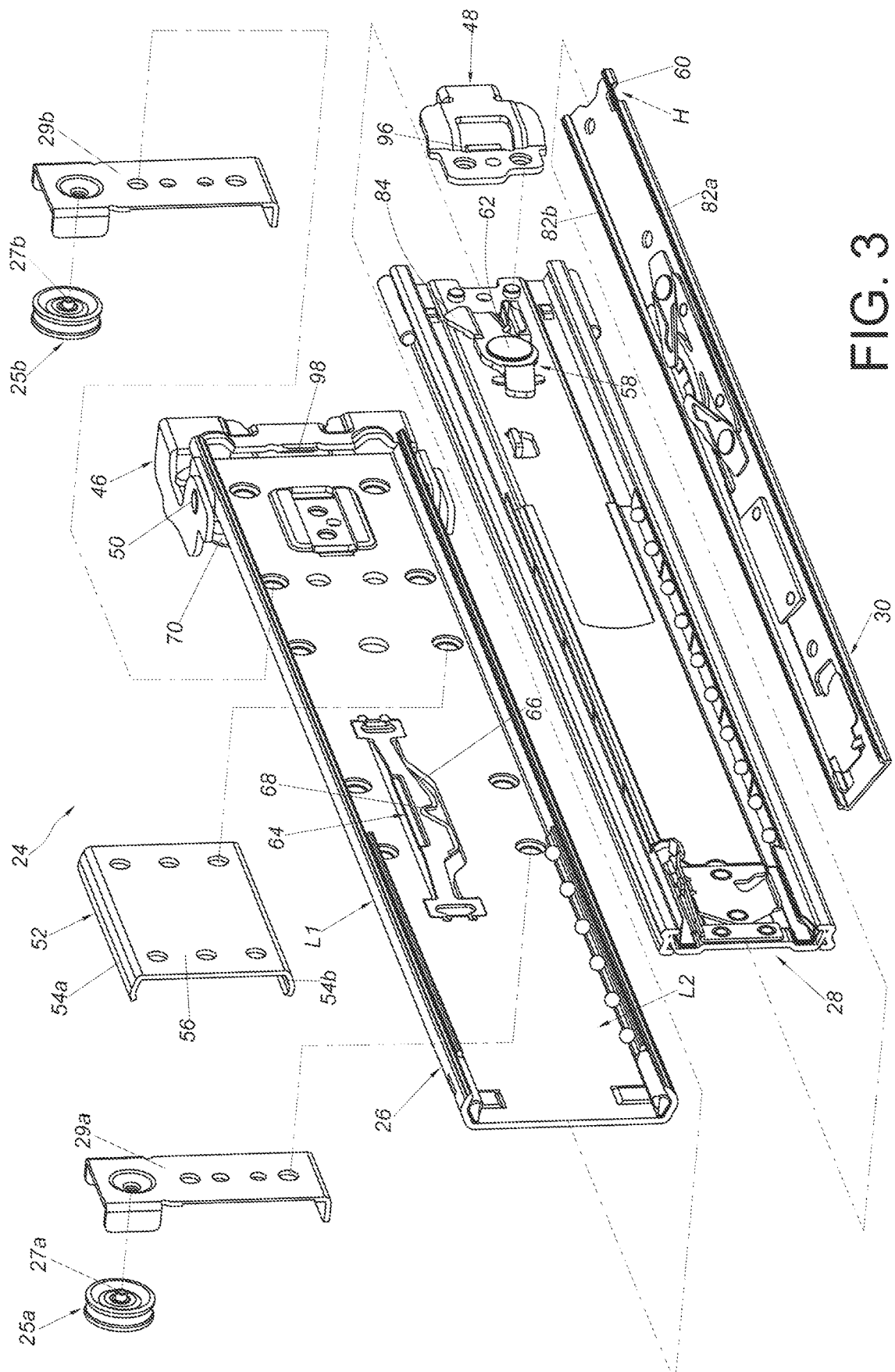
FIG. 3 is an exploded diagram of a slide rail assembly of the slide rail mechanism according to the embodiment of the present invention.

As shown in FIG. 1 to FIG. 3, a slide rail mechanism includes a first supporting member 22, a slide rail assembly 24 and at least one rolling member. A length M1 of the slide rail assembly 24 along a longitudinal direction is different from a length M2 of the first supporting member 22 along the longitudinal direction. For example, as shown in FIG. 1, the length M1 of the slide rail assembly 24 along the longitudinal direction can be less than the length M2 of the first supporting member 22. Furthermore, the slide rail assembly 24 includes a first rail 26. A length of the first rail 26 along the longitudinal direction is less than the length M2 of the first supporting member 22 along the longitudinal direction. Besides, the slide rail mechanism further includes a second supporting member 34 connected to the first supporting member 22, and the length of the first rail 26 along the longitudinal direction is less than a length of the second supporting member 34 along the longitudinal direction. The first rail 26 and the first supporting member 22 are displaceable relative to each other. In this embodiment, by way of example, the longitudinal direction can be defined by a length direction or a displacing direction of a slide rail, e.g., the first rail 26, and parallel to an X axis. A transverse direction can be defined by a lateral direction or a width direction of the slide rail, e.g., the first rail 26, and parallel to a Y axis. A vertical direction can be defined by a height direction of the slide rail, e.g., the first rail 26, and parallel to a Z axis. The second supporting member 34 can be a supporting frame configured to enable the first supporting member 22 and the slide rail assembly 24 to be mounted on a rack.

In this embodiment, by way of example, the at least one rolling member can include a first rolling member 25a, e.g., a front rolling member, and a second rolling member 25b, e.g., a rear rolling member. The first rolling member 25a and the second rolling member 25b are configured to facilitate the first rail 26 and the first supporting member 22 to be displaceable relative to each other. However, the present invention is not limited to this embodiment. For example, in another embodiment, the slide rail mechanism can include only one rolling member.

Preferably, the first rolling member 25a and the second rolling member 25b are arranged on one of the first rail 26 and the first supporting member 22 and rotatably contacting with the other one of the first rail 26 and the first supporting member 22. In this embodiment, by way of example, the first rolling member 25a and the second rolling member 25b can be arranged on the first rail 26 and spaced from each other at a distance along the longitudinal direction. Furthermore, the first rolling member 25a is pivotally connected to a first mounting member 29a by a first shaft 27a, and the second rolling member 25b is pivotally connected to a second mounting member 29b by a second shaft 27b. In this embodiment, by way of example, each of the first mounting member 29a and the second mounting member 29b can be fixedly connected to the first rail 26 and therefore regarded as a part of the first rail 26. Understandably, in another embodiment, the first mounting member and the second mounting member can be detachably connected to the first rail.

Preferably, the slide rail mechanism further includes a slide rail device 32. The slide rail device 32 includes the first supporting member 22 and the second supporting member 34. In this embodiment, by way of example, the first supporting member 22 and the second supporting member 34 can be fixedly connected to each other and therefore regarded as an integral structure. However, the present invention is not limited to this embodiment. The first rolling member 25a and the second rolling member 25b are displaceable together with the first rail 26. Furthermore, the first rail 26 is displaceable relative to the first supporting member 22 along the longitudinal direction by the first rolling member 25a and the second rolling member 25b. The configuration of the first rolling member 25a and the second rolling member 25b can reduce a friction force resisting a displacement of the first rail 26 relative to the first supporting member 22 for ensuring the first rail 26 to displace relative to the first supporting member 22 smoothly.

Preferably, the first rolling member 25a and the second rolling member 25b can be members with arc-shaped contours, e.g., rollers or balls. However, the present invention is not limited thereto.

The slide rail assembly 24 further includes a second rail 28 and a third rail 30. In this embodiment, by way of example, the first rail 26, the second rail 28 and the third rail 30 can be an outer rail, a middle rail and an inner rail, and the second rail 28 can be movably mounted between the first rail 26 and the third rail 30.

Preferably, the second supporting member 34 includes a disengaging feature 36 and a blocking feature 37 located adjacent to the disengaging feature 36. In this embodiment, by way of example, the disengaging feature 36 can be formed by excavating, and the blocking feature 37 can be a wall. However, the present invention is not limited to this embodiment.

Preferably, a blocking portion 38 is arranged on the first supporting member 22. In this embodiment, by way of example, the first supporting member 22 can include a bracket 40 located adjacent to an end portion, e.g., a front end portion, of the first supporting member 22, and the blocking portion 38 can be arranged on the bracket 40.

Preferably, the first supporting member 22 further includes a supporting channel configured to at least partially receive a plurality of movable rails, e.g., a first movable rail 42 and a second movable rail 44. The first movable rail 42 is located between the first supporting member 22 and the second movable rail 44. A length of the third rail 30 of the slide rail assembly 24 along the longitudinal direction is less than a length of the second movable rail 44 of the slide rail device 32 along the longitudinal direction. It should be noticed that the third rail 30 of the slide rail assembly 24 is configured to support a first object, which is not shown in the figures, and the second movable rail 44 of the slide rail device 32 is configured to support a second object, which is not shown in the figures. After the second object is detached from the second movable rail 44, or after the second movable rail 44 and the second object are together detached from the first movable rail 42, the first rail 26 of the slide rail assembly 24 can displace relative to the first supporting member 22 and/or the second supporting member 34 of the slide rail device 32 along the longitudinal direction by the first rolling member 25a and the second rolling member 25b. During a displacement of the first rail 26 or the slide rail assembly 24 relative to the first supporting member 22 or the slide rail device 32 along the longitudinal direction, the configuration of the first rolling member 25a and the second rolling member 25b can reduce a friction force resisting the displacement of the first rail 26 or the slide rail assembly 24 relative to the first supporting member 22 or the slide rail device 32 along the longitudinal direction. Therefore, the present invention can achieve an effect of saving effort.

Preferably, the slide rail assembly 24 further includes a first auxiliary member 46 and a second auxiliary member 48. The first auxiliary member 46 is arranged on the first rail 26. The second auxiliary member 48 is arranged on the second rail 28.

Preferably, one of the first auxiliary member 46 and the second auxiliary member 48 is movable. The other one of the first auxiliary member 46 and the second auxiliary member 48 is immovable. In this embodiment, by way of example, the first auxiliary member 46 can be pivotally connected to the first rail 26 by a shaft 50, so as to be pivotable relative to the first rail 26. The second auxiliary member 48 can be fixedly connected to the second rail 28.

Preferably, the slide rail assembly 24 further includes an auxiliary rail 52 arranged on the first rail 26. The first rail 26 is movably mounted on one of the first supporting member 22 and the second supporting member 34 by the auxiliary rail 52. Furthermore, the auxiliary rail 52 includes a first auxiliary wall 54a, a second auxiliary wall 54b and a middle wall 56 connected between the first auxiliary wall 54a and the second auxiliary wall 54b. The middle wall 56 is connected to a first side L1 of the first rail 26. As shown in FIG. 3, in this embodiment, by way of example, the middle wall 56 can be fixedly connected to the first side L1 of the first rail 26, and the first side L1 of the first rail 26 can be a back side of the first rail 26 located adjacent to the first supporting member 22 or the second supporting member 34. The first auxiliary wall 54a and the second auxiliary wall 54b are configured to hold the first supporting member 22 or the second supporting member 34. In this embodiment, by way of example, the first auxiliary wall 54a and the second auxiliary wall 54b can hold a first wall 57a and a second wall 57b of the first supporting member 22 respectively, and the first wall 57a and the second wall 57b of the first supporting member 22 can be an upper wall and a lower wall of the first supporting member 22 respectively. However, the present invention is not limited to this embodiment. In addition, as shown in FIG. 3, the second rail 28 is at least partially movably mounted inside a first channel of the first rail 26 formed on a second side L2 of the first rail 26 opposite to the first side L1 of the first rail 26. Besides, the third rail 30 is at least partially movably mounted inside a second channel of the second rail 28.

Preferably, as shown in FIG. 3, the slide rail assembly 24 further includes a working member 58 movably mounted on the second rail 28. A corresponding feature 60 is arranged on the third rail 30 and configured to cooperate with the working member 58. The third rail 30 can drive the second rail 28 to synchronously displace together with the third rail 30 by an abutment of the corresponding feature 60 and the working member 58.

Preferably, the working member 58 is pivotally connected to the second rail 28 by a connecting member 62.

Preferably, a retaining member 64 is arranged on the first rail 26. In this embodiment, by way of example, the retaining member 64 can be a resilient element, such as a resilient plate. However, the present invention is not limited to this embodiment. The retaining member 64 includes a disengaging structure 66 and a blocking structure 68 located adjacent to the disengaging structure 66. In this embodiment, by way of example, the disengaging structure 66 can be an inclined surface or an arc surface, and the blocking structure 68 can be a wall, such as a vertical wall. However, the present invention is not limited to this embodiment. Understandably, in another embodiment, the disengaging structure and/or the blocking structure can be integrally connected to the first rail.

Figure 4:
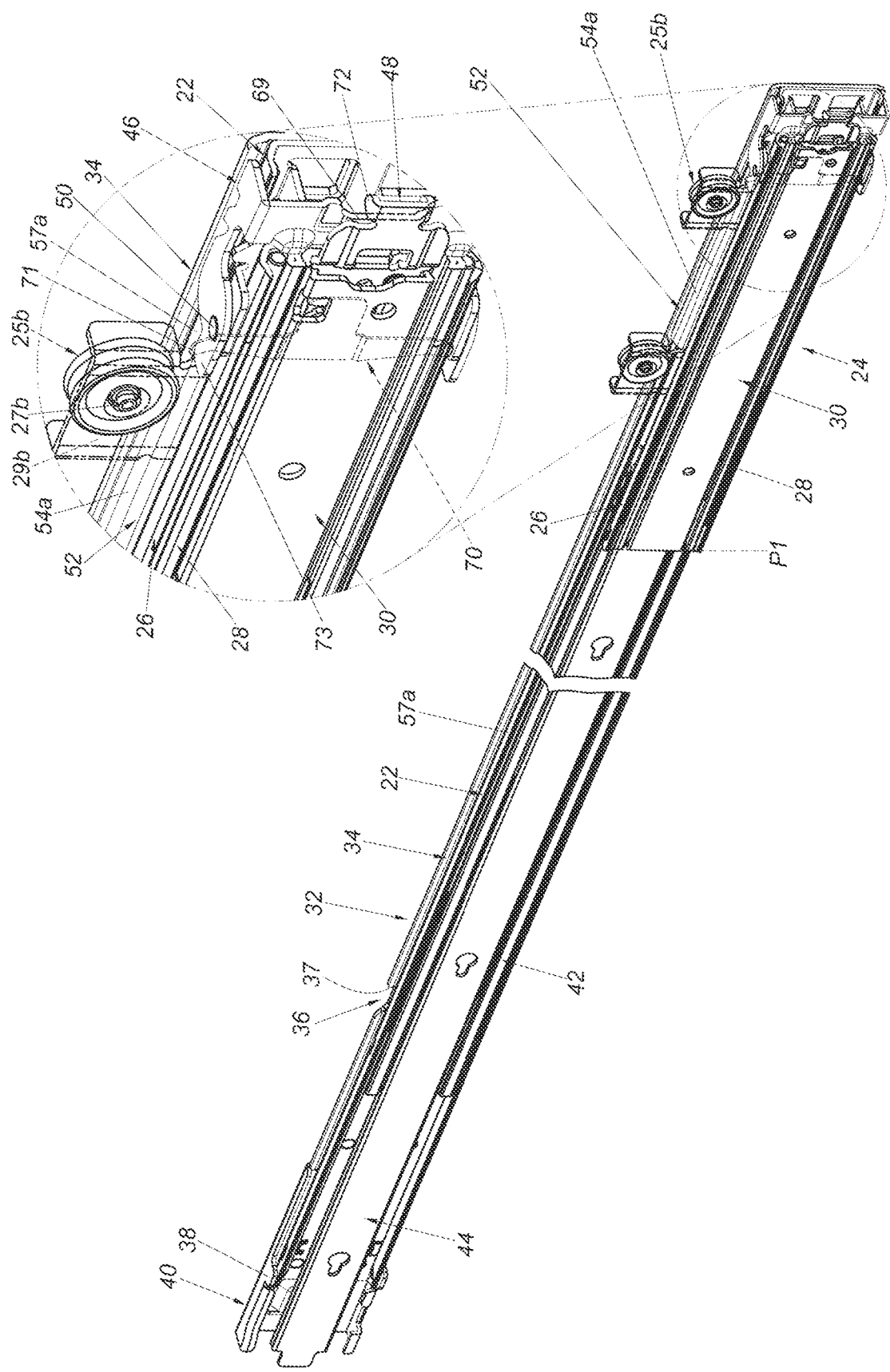
FIG. 4 is a diagram of the slide rail mechanism as the slide rail assembly is in a retracted state according to the embodiment of the present invention.
Figure 5:
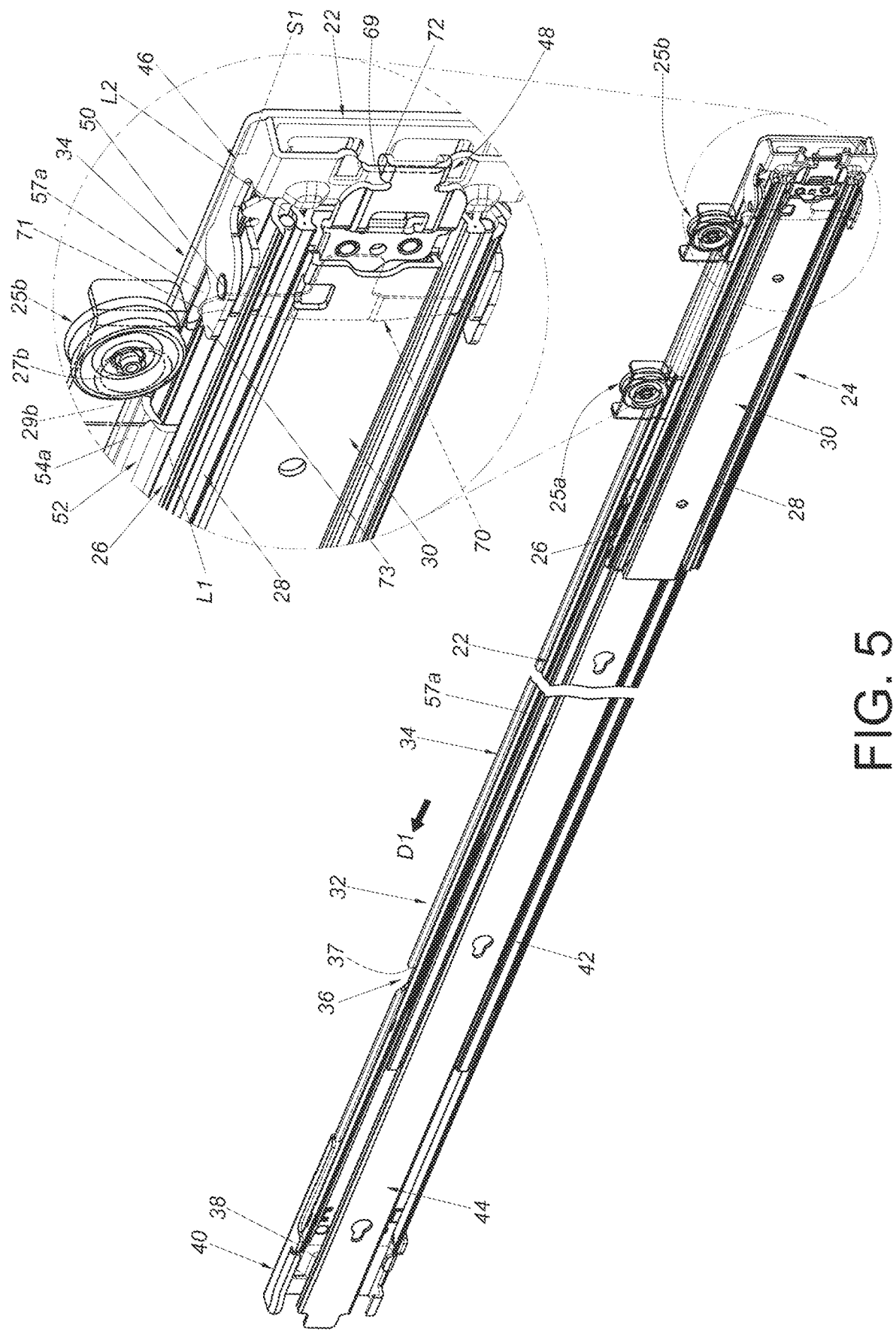
FIG. 5 is a diagram of the slide rail mechanism as a second rail and a first rail of the slide rail assembly are synchronously displaceable along a first predetermined direction according to the embodiment of the present invention.

As shown in FIG. 4 and FIG. 5, the slide rail assembly 24 is in a retracted state relative to the first supporting member 22 or the slide rail device 32. As shown in FIG. 5, the second auxiliary member 48 can abut against the first auxiliary member 46 for driving the first rail 26 to displace together with the second rail 28 during a displacement of the second rail 28 away from a first predetermined position P1 along a first predetermined direction D1. Besides, the second rail 28 can be driven by the third rail 30 to synchronously displace together with the third rail 30 by an abutment of the corresponding feature 60 and the working member 58 during a displacement of the third rail 30 along the first predetermined direction D1. Therefore, when the third rail 30 is operated to displace along the first predetermined direction D1, the second rail 28 can synchronously displace together with the third rail 30 and the first rail 26 can synchronously displace together with the second rail 28, i.e., the third rail 30, the second rail 28 and the first rail 26 can synchronously displace together along the first predetermined direction D1. During a displacement of the first rail 26 along the first predetermined direction D1, the first rail 26 engages with the first wall 57a of the first supporting member 22 via the first rolling member 25a and the second rolling member 25b, and the configuration of the first rolling member 25a and the second rolling member 25b can reduce the friction force resisting the displacement of the first rail 26 relative to the first supporting member 22 along the first predetermined direction D1 by rotating movements of the first rolling member 25a and the second rolling member 25b relative to the first wall 57a, e.g., the upper wall, of the first supporting member 22. Besides, the first wall 57a, e.g., the upper wall, of the first supporting member 22 can support the first rolling member 25a and the second rolling member 25b for enhancing a supporting strength of the first rail 26 or the slide rail assembly 24. Preferably, since the first auxiliary wall 54a and the second auxiliary wall 54b of the auxiliary rail 52 hold the first wall 57a and the second wall 57b respectively, it facilitates stability and reliability of the displacement of the first rail 26 relative to the first t supporting member 22 along the first predetermined direction D1.

Preferably, as shown in FIG. 5, the slide rail assembly 24 further includes a resilient member 70. The first auxiliary member 46 is retained in a first state S1 for abutting against the second auxiliary member 48 in response to a resilient force provided by the resilient member 70 and/or a support of the second supporting member 34. As shown in FIG. 4 and FIG. 5, in this embodiment, by way of example, the second auxiliary member 48 can include at least one abutting portion 72, such as a hook portion or a hook-shaped structure, configured to abut against a corresponding portion 69 of the first auxiliary member 46 for driving the first rail 26 to synchronously displace together with the second rail 28 during the displacement of the second rail 28 away from the first predetermined position P1 along the first predetermined direction D1.

Preferably, the resilient member 70 is arranged on the first side L1 of the first rail 26 and hidden between the first rail 26 and the first supporting member 22 or between the first rail 26 and the slide rail device 32. In this embodiment, by way of example, the resilient member 70 can be a resilient plate. However, the present invention is not limited to this embodiment. As shown in FIG. 5, the resilient member 70 includes at least one resilient portion 71 for providing the resilient force to at least one extending portion 73 of the first auxiliary member 46, and the second supporting member 34 supports the first auxiliary member 46, such that the first auxiliary member 46 is retained in the first state S1.

Figure 6:
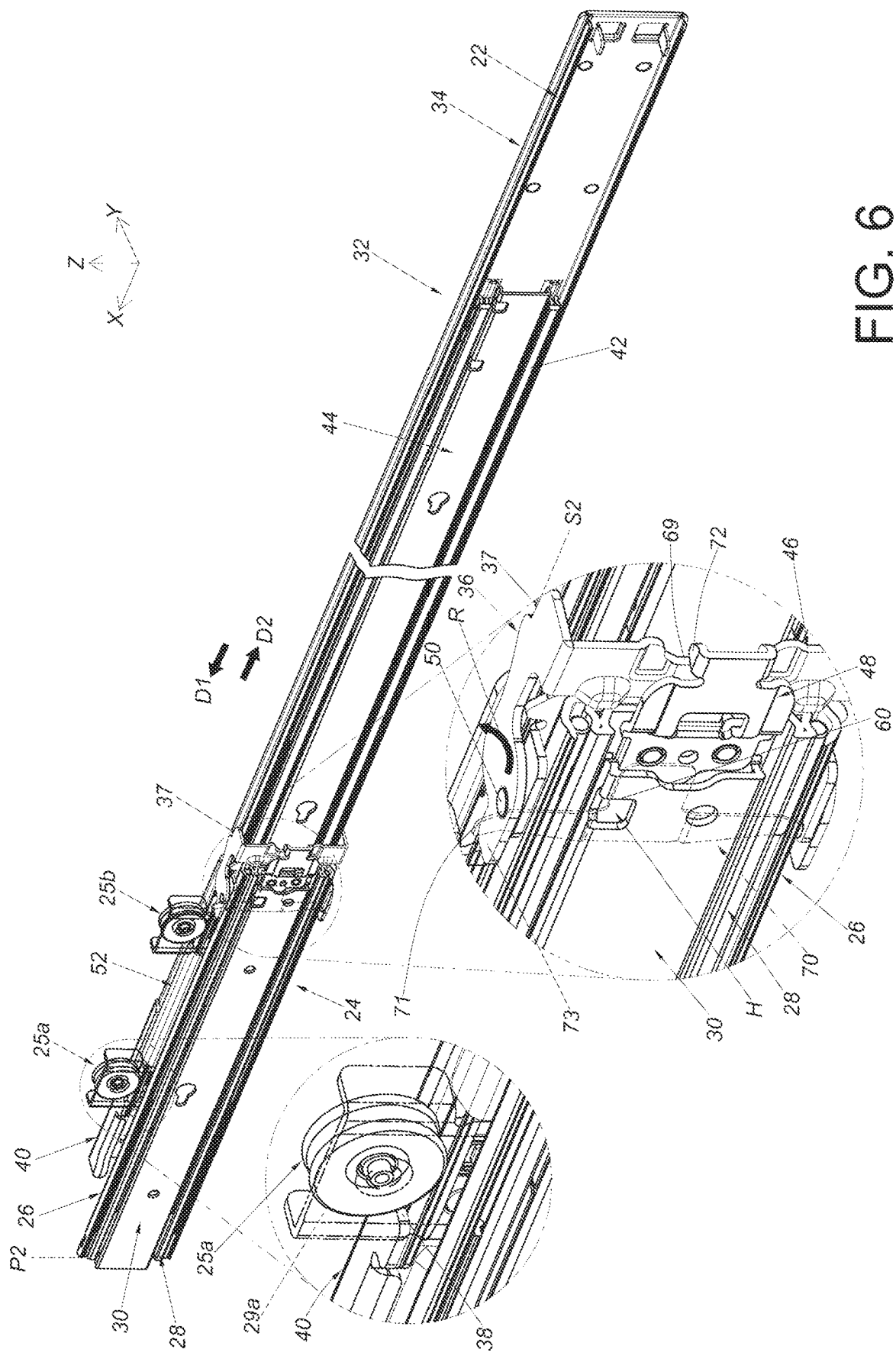
FIG. 6 is a diagram of the slide rail mechanism as displacement synchronization between the second rail and the first rail of the slide rail assembly is terminated according to the embodiment of the present invention.

As shown in FIG. 6, the disengaging feature 36 of the second supporting member 34 is configured to terminate displacement synchronization between the second rail 28 and the first rail 26 when the second rail 28 and the first rail 26 are synchronously displaced to a second predetermined position P2 along the first predetermined direction D1.

Preferably, when the first rail 26 is located at the second predetermined position P2, the disengaging feature 36 of the second supporting member 34 is configured to provide a moving space for the first auxiliary member 46, so as to release the resilient member 70 to drive the first auxiliary member 46 to move, e.g., pivot along a predetermined pivoting direction R, from the first state S1 to a second state S2 for disengaging the first auxiliary member 46 from the second auxiliary member 48, such that the corresponding portion 69 of the first auxiliary member 46 can be moved to be misaligned with the at least one abutting portion 72 of the second auxiliary member 48 along the longitudinal direction, e.g., the X axis, so as to terminate the displacement synchronization between the second rail 28 and the first rail 26.

Preferably, when the first auxiliary member 46 is in the second state S2, the blocking feature 37 of the second supporting member 34 can block the first auxiliary member 46 for preventing the first rail 26 from displacing away from the second predetermined position P2 along a second predetermined direction D2, e.g., a retracting direction, opposite to the first predetermined direction D1. Moreover, the blocking portion 38 on the first supporting member 22 can block one of the first rail 26 and the auxiliary rail 52 for preventing the first rail 26 from displacing away from the second predetermined position P2 along the first predetermined direction D1. In this embodiment, by way of example, the blocking portion 38 arranged on the bracket 40 of the first supporting member 22 can block the first mounting member 29a of the first rail 26. However, the present invention is not limited to this embodiment.

Figure 7:
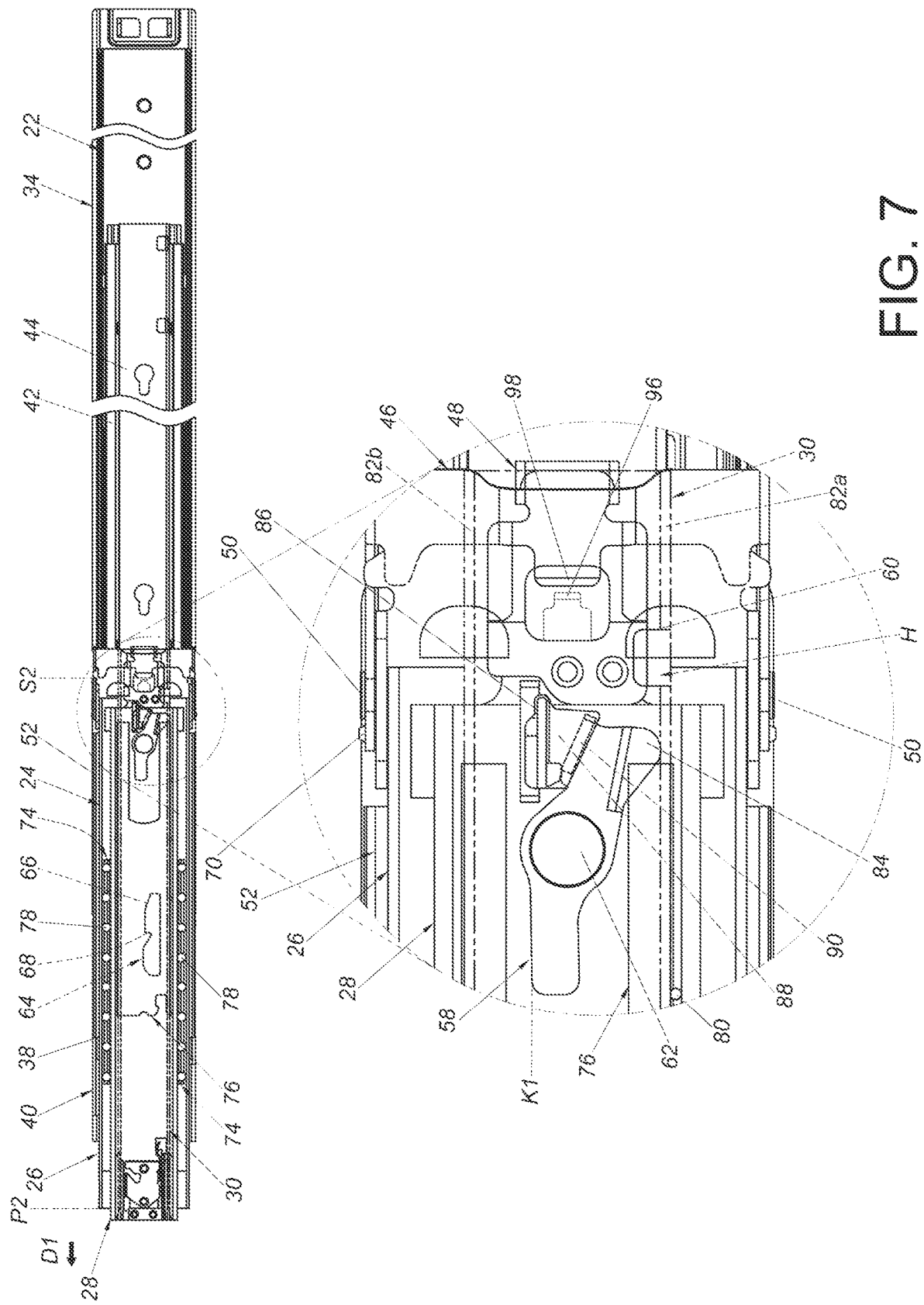
FIG. 7 is a diagram of the slide rail mechanism as a third rail and the second rail of the slide rail assembly are not synchronously displaceable along the first predetermined direction according to the embodiment of the present invention.
Figure 8:
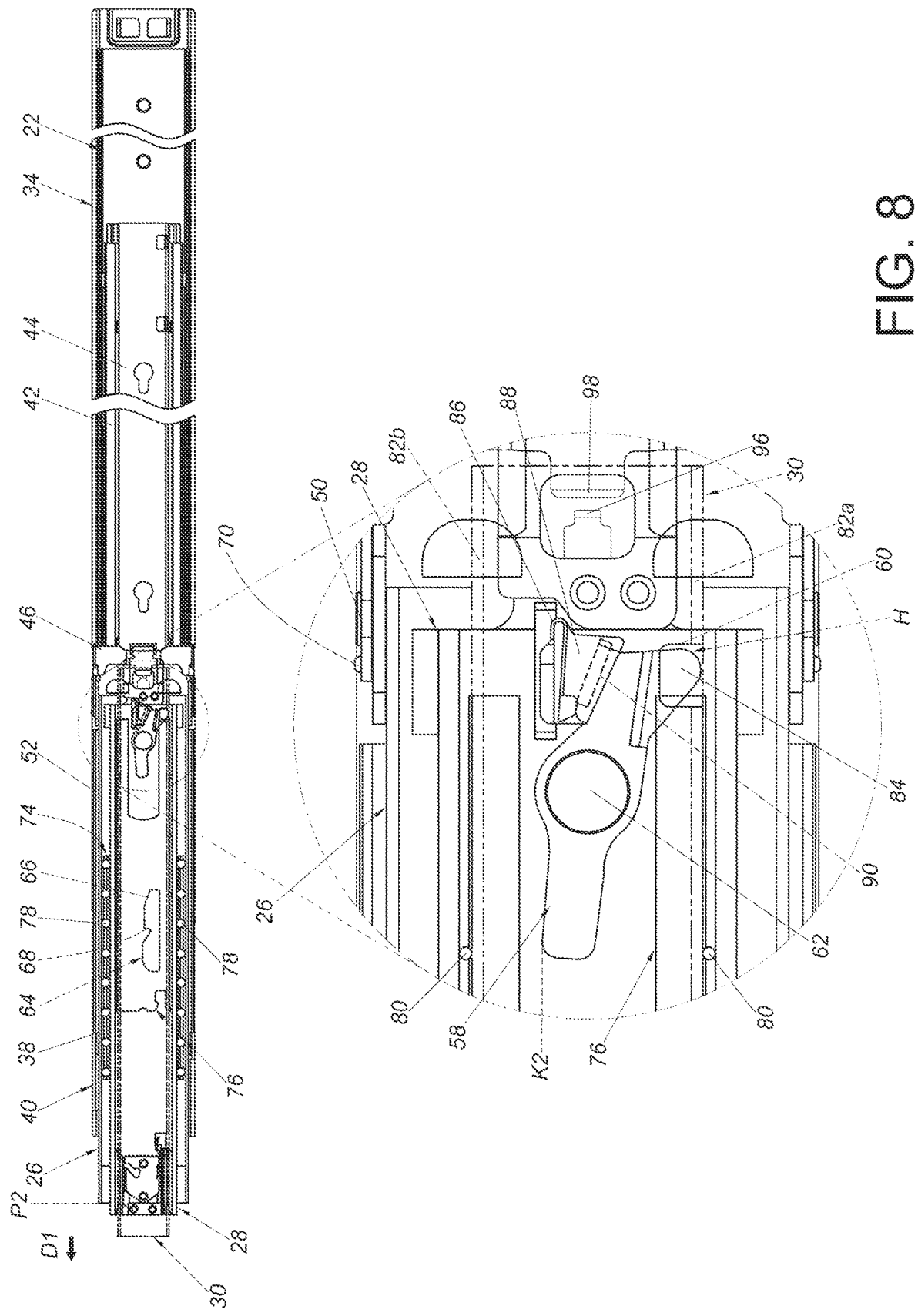
FIG. 8 is a diagram of the slide rail mechanism as the third rail and the second rail of the slide rail assembly are synchronously displaceable along the first predetermined direction according to the embodiment of the present invention

FIG. 7 to FIG. 13 does not illustrate the first rolling member 25a, the second rolling member 25b, the first mounting member 29a and the second mounting member 29b for simplicity. As shown in FIG. 7 and FIG. 8, the slide rail assembly 24 further includes at least one first slide-aiding device 74 and a second slide-aiding device 76. The at least one first slide-aiding device 74 is movably mounted between the second rail 28 and the first rail 26 for facilitating a smooth displacement of the second rail 28 relative to the first rail 26. The second slide-aiding device 76 is movably mounted between the second rail 28 and the third rail 30 for facilitating a smooth displacement of the third rail 30 relative to the second rail 28. In this embodiment, by way of example, the first slide-aiding device 74 can include a plurality of first slide-aiding members 78, and the second slide-aiding device 76 can include a plurality of second slide-aiding members 80, wherein the first slide-aiding member 78 or the second slide-aiding member 80 can be a ball, a roller, or the like.

In detail, during a displacement of the second rail 28 from the first predetermined position P1 to the second predetermined position P2, if the third rail 30 does not displace relative to the second rail 28 along the first predetermined direction D1, the corresponding feature 60 on the third rail and the working member 58 on the second rail 28 are spaced from each other at a predetermined distance along the longitudinal direction. Preferably, during the displacement of the third rail 30 along the first predetermined direction D1, the third rail 30 drives the second rail 28 to displace along the first predetermined direction D1 by a frictional force therebetween as shown in FIG. 7 before the abutment of the corresponding feature 60 and the working member 58, and then the third rail 30 drives the second rail 28 to synchronously displace together with the third rail 30 by the abutment of the corresponding feature 60 and the working member 58 as shown in FIG. 8 after the abutment of the corresponding feature 60 and the working member 58.

Preferably, the third rail 30 includes a first wall 82a and a second wall 82b, and the corresponding feature 60 is arranged on the first wall 82a of the third rail 30. For example, the corresponding feature 60 can be a hole wall of a hole H. The first wall 82a of the third rail 30 can support the working member 58 for retaining the working member 58 in an initial state K1 as shown in FIG. 7. During the displacement of the third rail 30 along the first predetermined direction D1, the hole H formed on the third rail 30 moves to a position corresponding to a synchronization feature 84 of the working member 58 for allowing the working member 58 to move, e.g., pivot, from the initial state K1 to a predetermined position K2 as shown in FIG. 8 in response to a resilient force provided by a resilient object 86, such that the corresponding feature 60 on the third rail 30 abuts against the synchronization feature 84 of the working member 58 to enable the third rail 30 to drive the second rail 28 to synchronously displace together with the third rail 30 as shown in FIG. 8.

Preferably, as shown in FIG. 8, the second rail 28 includes a through hole 88, and a working portion 90 of the working member 58 extends toward the first rail 26 through the through hole 88. The working portion 90 of the working member 58 can cooperate with the retaining member 64, e.g., the disengaging structure 66 and the blocking structure 68 of the retaining member 64, on the first rail 26.

Figure 9:
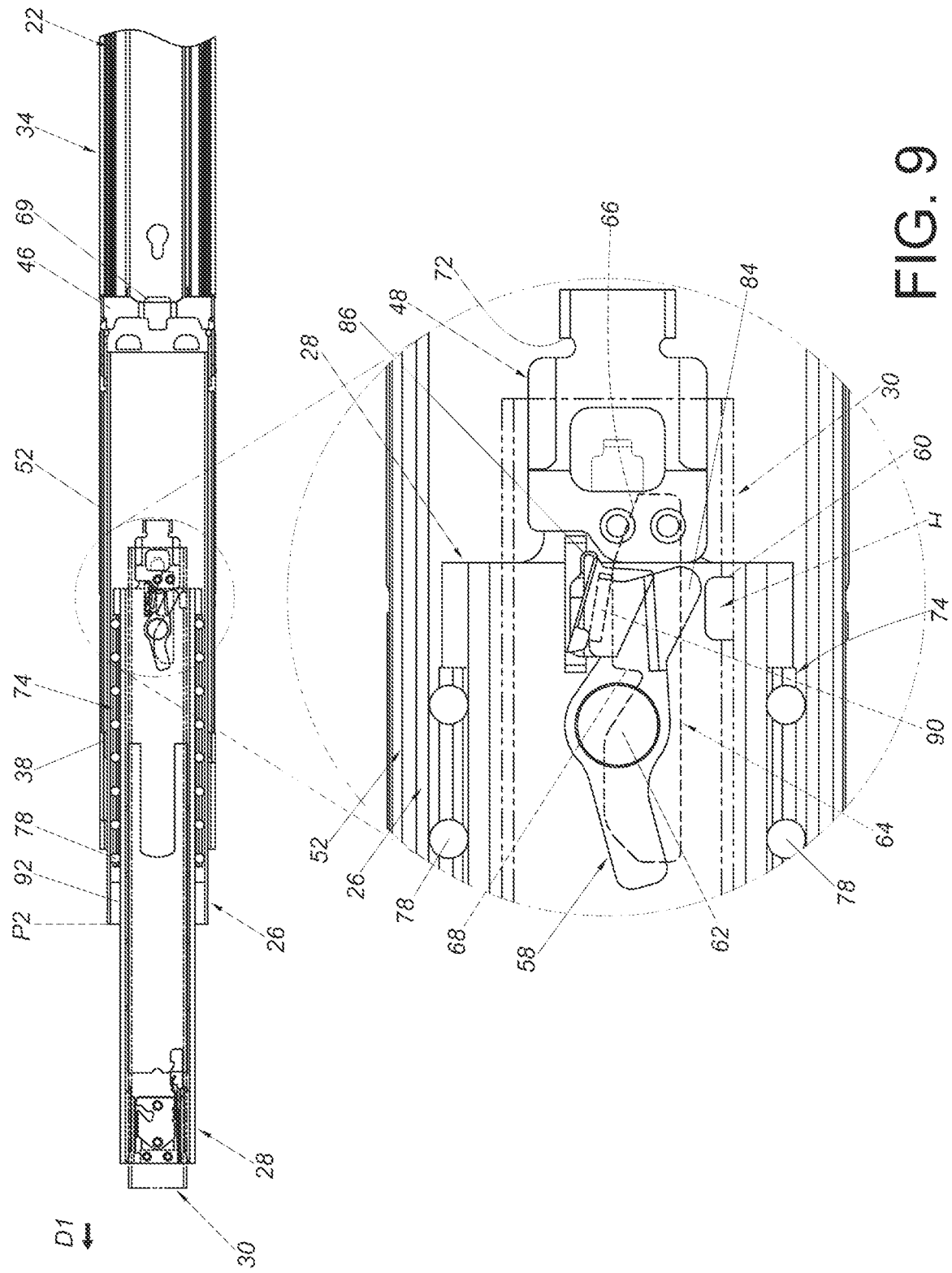
FIG. 9 is a diagram of the slide rail mechanism as displacement synchronization between the third rail and the second rail of the slide rail assembly is terminated according to the embodiment of the present invention.

When the third rail 30 drives the second rail 28 to synchronously displace together with the third rail 30 from a position as shown in FIG. 8 to a disengaging position as shown in FIG. 9, the disengaging structure 66 on the first rail 26 is configured to terminate displacement synchronization between the third rail 30 and the second rail 28. In this embodiment, by way of example, the working portion 90 of the working member 58 on the second rail 28 can be guided by the disengaging structure 66 on the first rail 26 to drive the working member 58 to move away from the predetermined state K2, e.g., by pivoting at a predetermined angle, such that the corresponding feature 60 on the third rail 30 does not abut against the synchronization feature 84 of the working member 58 for terminating the synchronization displacement between the third rail 30 and the second rail 28. After the synchronization displacement between the third rail 30 and the second rail 28 is terminated, the third rail 30 and the second rail 28 can be individually displaced relative to the first rail 26 along the first predetermined direction D1. Besides, when the working member 58 is in a state as shown in FIG. 9, the resilient object 86 is resiliently deformed.

Figure 10:
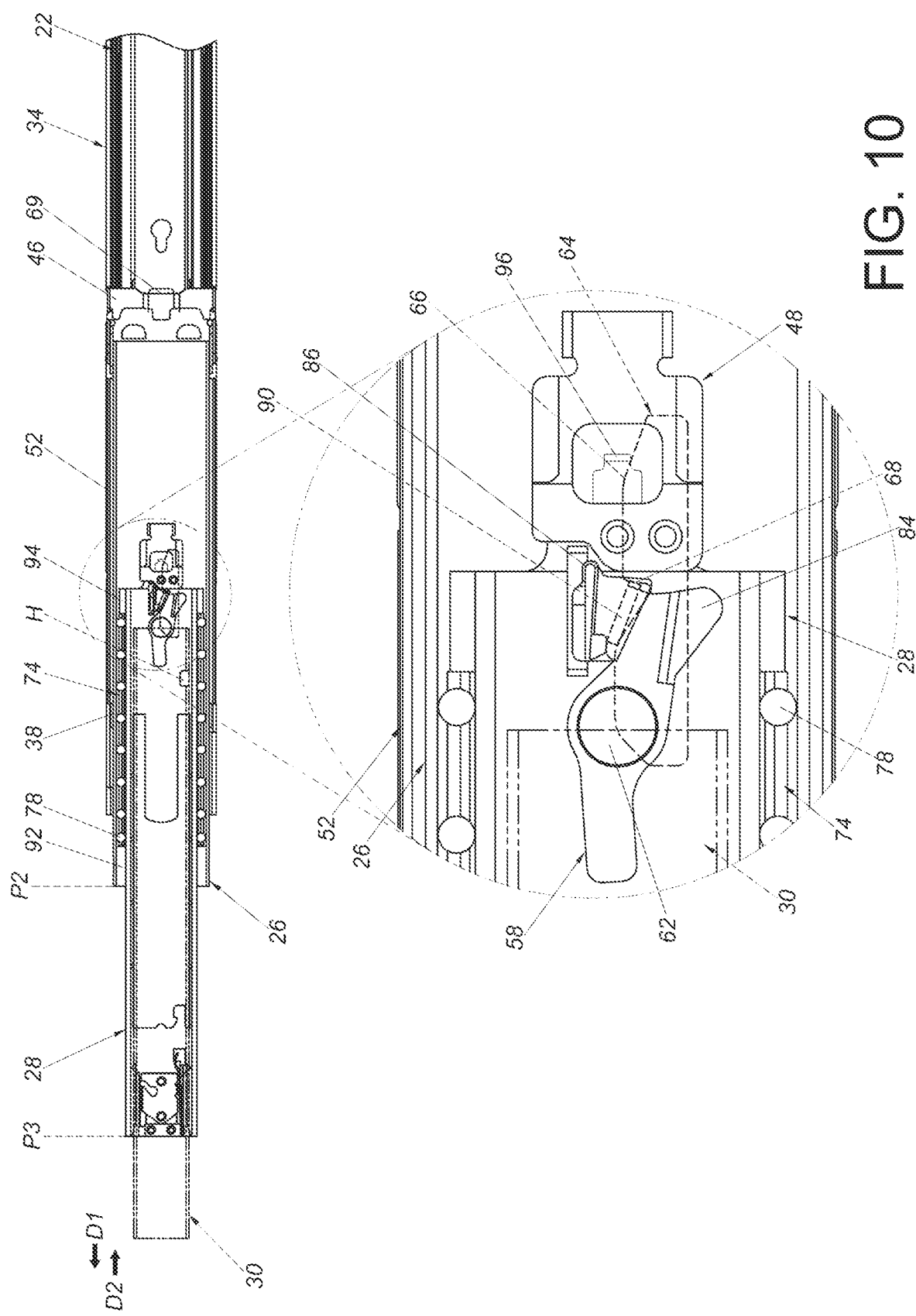
FIG. 10 is a diagram of the slide rail mechanism as the second rail of the slide rail assembly is located at a third predetermined position according to the embodiment of the present invention.

As shown in FIG. 10, when the second rail 28 is further displaced to a third predetermined position P3 along the first predetermined direction D1, the blocking structure 68 on the first rail 26 is configured to block the second rail 28 for preventing the second rail 28 from displacing away from the third predetermined position P3 along the second predetermined direction D2. In this embodiment, by way of example, when the second rail 28 is located at the third predetermined position P3, the resilient object 86 can be released to drive the working member 58 to move to a position as shown in FIG. 10, such that the working portion 90 of the working member 58 can be blocked by the blocking structure 68 on the first rail 26 for preventing the second rail 28 from displacing away from the third predetermined position P3 along the second predetermined direction D2.

Preferably, a first restraining feature 92 is further arranged on the first rail 26, and a second restraining feature 94 is further arranged on the second rail 28. When the second rail 28 is located at the third predetermined position P3, a front end and a rear end of the first slide-aiding device 74 abut against the first restraining feature 92 and the second restraining feature 94 respectively for preventing the second rail 28 from displacing away from the third predetermined position P3 along the first predetermined direction D1.

Figure 11:
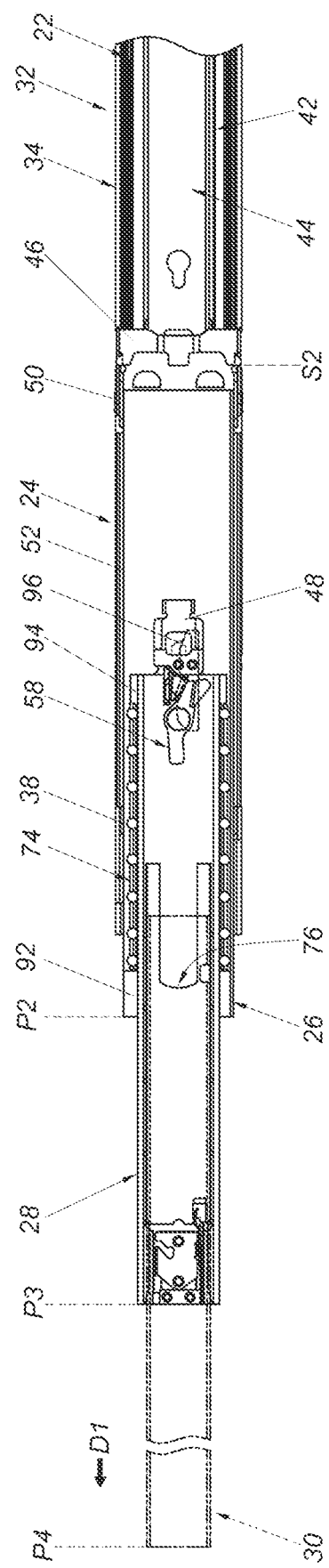
FIG. 11 is a diagram of the slide rail mechanism as the slide rail assembly is in an extended state according to the embodiment of the present invention.

As shown in FIG. 11, when the second rail 28 is located at the third predetermined position P3, the third rail 30 can be further displaced to a fourth predetermined position P4 along the first predetermined direction D1, so as to locate the slide rail assembly 24 in an extended state, e.g., a fully extended state, relative to the first supporting member 22 or the slide rail device 32. Preferably, when the third rail 30 is located at the fourth predetermined position P4, the second slide-aiding device 76 is located adjacent to an end portion, e.g., a front end portion, of the second rail 28.

Figure 12:
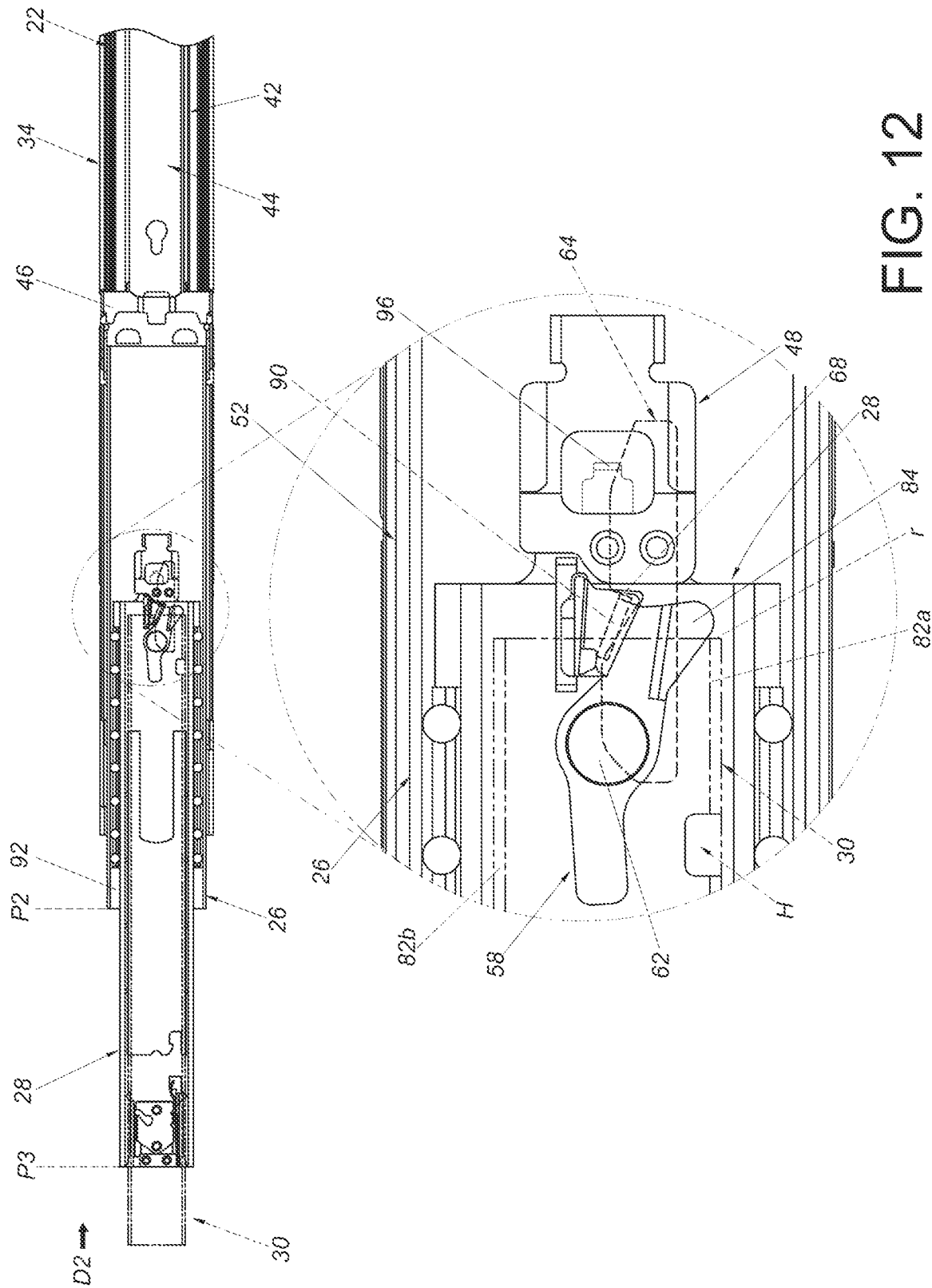
FIG. 12 is a diagram of the slide rail mechanism as the third rail of the slide rail assembly displaces away from a fourth predetermined position along a second predetermined direction according to the embodiment of the present invention.
Figure 13:
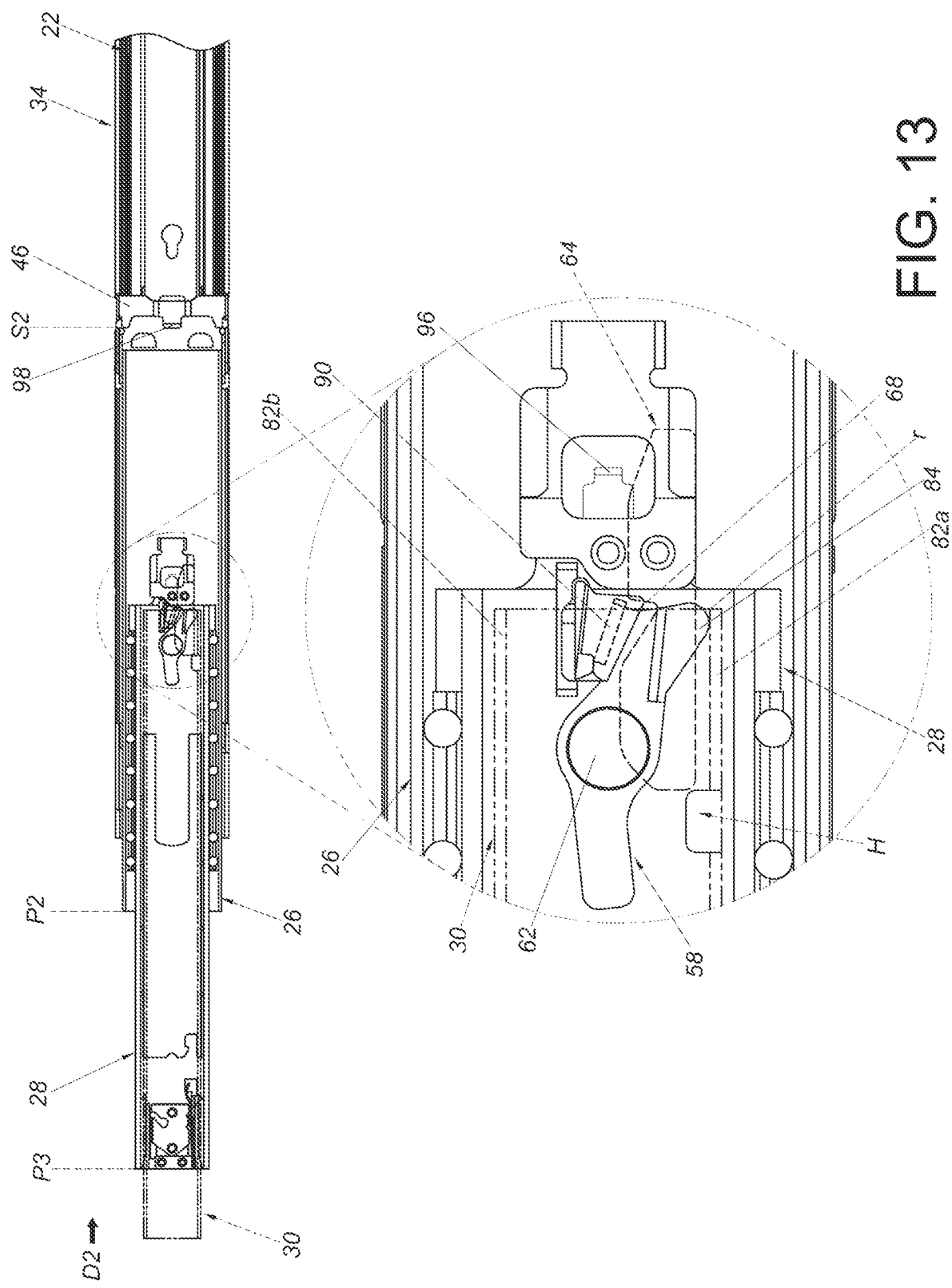
FIG. 13 is a diagram of the slide rail mechanism as the second rail of the slide rail assembly is displaceable away from the third predetermined position along the second predetermined direction by the third rail displacing along the second predetermined direction according to the embodiment of the present invention.

As shown in FIG. 12 and FIG. 13, during a displacement of the third rail 30 away from the fourth predetermined position P4 along the second predetermined direction D2, the third rail 30 is configured to terminate a blocking relation between the blocking structure 68 and the second rail 28. Furthermore, as shown in FIG. 12 and FIG. 13, a portion, e.g., a rear end portion r, of the third rail 30, is configured to abut against the synchronization feature 84 of the working member 58 for driving the working member 58 to prevent the working portion 90 of the working member 58 from being blocked by the blocking structure 68 on the first rail 26. When the working portion 90 of the working member 58 is not blocked by the blocking structure 68 on the first rail 26, the second rail 28 is allowed to displace away from the third predetermined position P3 along the second predetermined direction D2.

Figure 14:
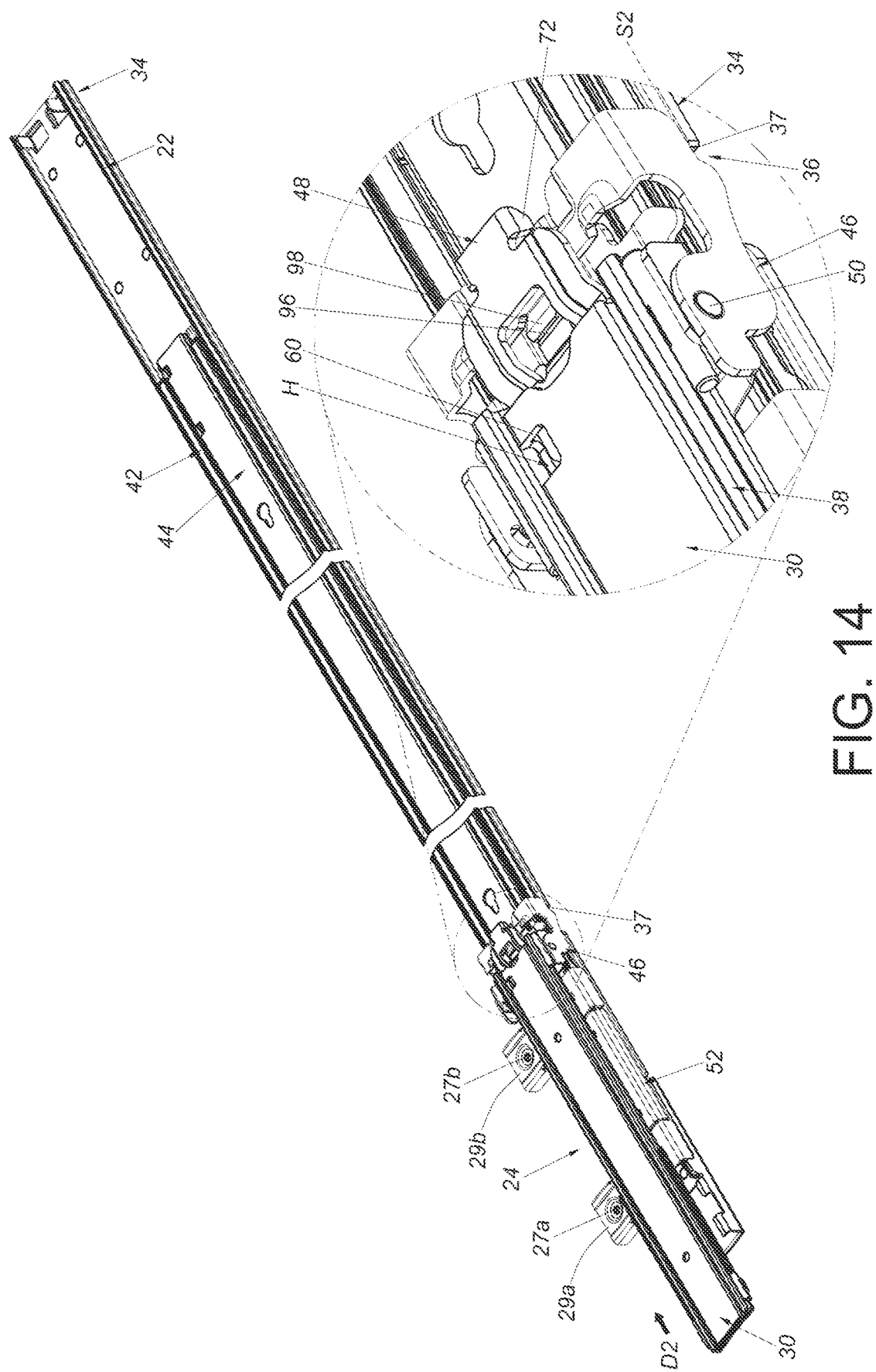
FIG. 14 is a diagram of the slide rail mechanism as the second rail of the slide rail assembly displaces away from the third predetermined position as shown in FIG. 13 along the second predetermined direction according to the embodiment of the present invention
Figure 15:
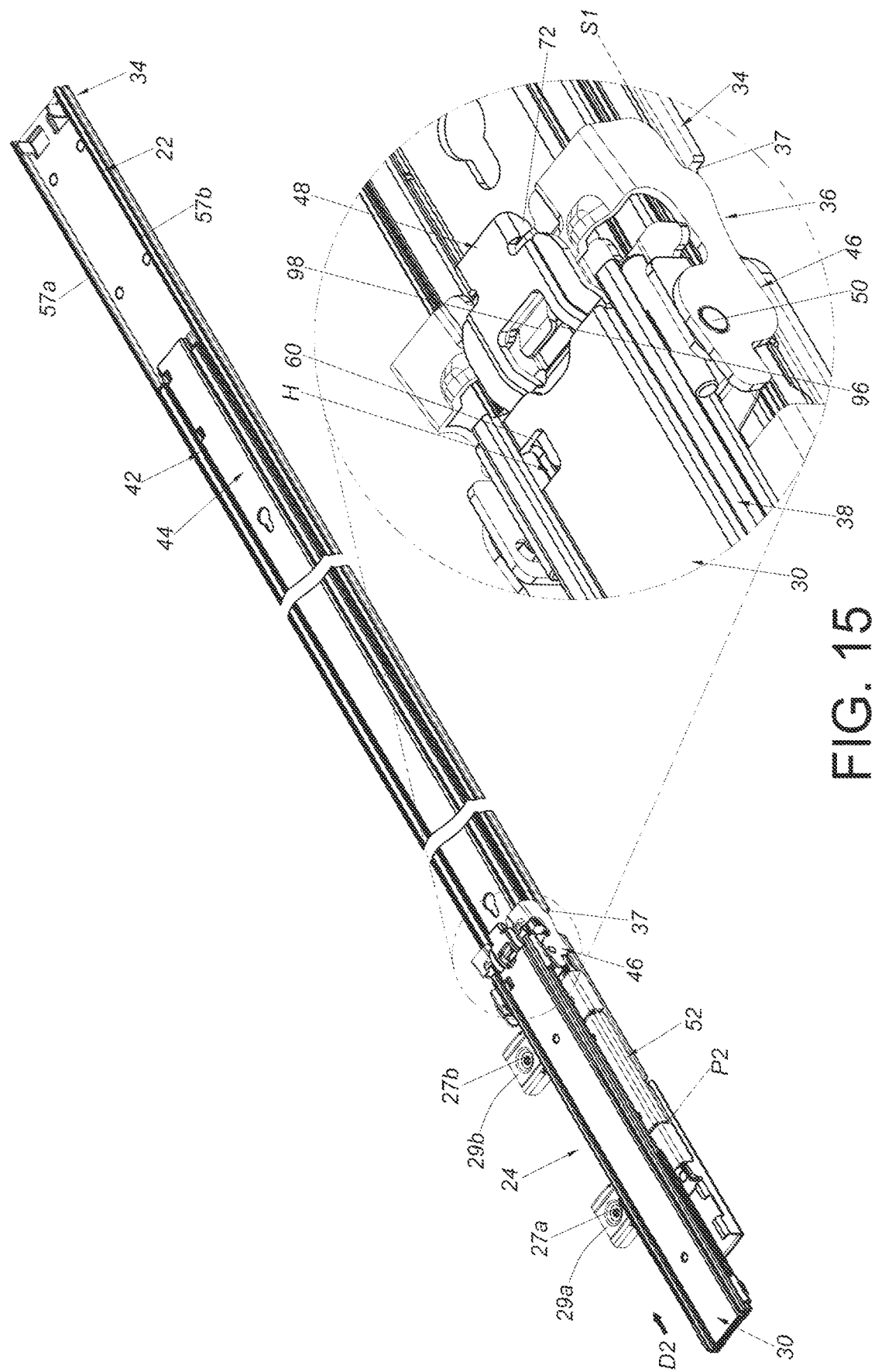
FIG. 15 is a diagram of the slide rail mechanism as the first rail of the slide rail assembly is displaceable away from the second predetermined position along the second predetermined direction by the second rail displacing along the second predetermined direction according to the embodiment of the present invention.

As shown in FIG. 14 and FIG. 15, one of the second rail 28 and the first auxiliary member 46 includes a first guiding feature 96. Preferably, the other one of the second rail 28 and the first auxiliary member 46 includes a second guiding feature 98 for cooperating with the first guiding feature 96. As shown in FIG. 3, in this embodiment, by way of example, the second rail 28 can include the first guiding feature 96 arranged on the second auxiliary member 48, and the first auxiliary member 46 can include the second guiding feature 98, wherein the first guiding feature 96 and the second guiding feature 98 can be inclined surfaces or arc surfaces. However, the present invention is not limited to this embodiment.

During a displacement of the second rail 28 away from the third predetermined position P3 along the second predetermined direction D2, the second rail 28 is configured to terminate a blocking relation between the blocking feature 37 and the first rail 26. In this embodiment, by way of example, the first guiding structure 96 of the second rail 28 can abut against the second guiding structure 98 of the first auxiliary member 46 for driving the first auxiliary member 46 from the second state S2 as shown in FIG. 14 to the first state S1 as shown in FIG. 15, such that the blocking feature 37 of the second supporting member 34 does not block the first auxiliary member 46 on the first rail 26 for allowing the first rail 26 and the auxiliary rail 52 to displace away from the second predetermined position P2 along the second predetermined direction D2. Accordingly, the third rail 30, the second rail 28 and the first rail 26 can be displaced along the second predetermined direction D2 until the slide rail assembly 24 is moved back to the retracted state as shown in FIG. 4. During a displacement of the first rail 26 or the slide rail assembly 24 relative to the first supporting member 22 or the slide rail device 32 along the second predetermined direction D2, the configuration of the first rolling member 25a and the second rolling member 25b can reduce a friction force resisting the displacement of the first rail 26 or the slide rail assembly 24 relative to the first supporting member 22 or the slide rail device 32 along the second predetermined direction D2 by the rotating movements of the first rolling member 25a and the second rolling member 25b relative to the first wall 57a, e.g., the upper wall, of the first supporting member 22. Besides, the first wall 57a, e.g., the upper wall, of the first supporting member 22 can support the first rolling member 25a and the second rolling member 25b for enhancing the supporting strength of the first rail 26 or the slide rail assembly 24.

It should be noticed that the slide rail assembly 24 can be adapted for the rack, and the third rail 30 can be configured to support the first object, such as an electronic apparatus or a drawer. The slide rail assembly 24 can ensure the second rail 28 and the first rail 26 to displace synchronously and prevent the third rail 30 and the second rail 28 from being pulled out along the first predetermined direction D1 without any displacement of the first rail 26. Therefore, the slide rail assembly 24 can solve a technical problem that it takes a lot of effort to overcome an excessive friction between a first rail and a supporting frame and/or between the first rail and a supporting rail caused by, e.g., a weight of a carried object, to pull out the first rail if a third rail and a second rail have been pulled out without any displacement of the first rail. Besides, the configuration of the first rolling member 25a and the second rolling member 25b can reduce the friction forces resisting the displacements of the first rail 26 or the slide rail assembly 24 relative to the first supporting member 22 or the slide rail device 32 along the first predetermined direction D1 and the second predetermined direction D2 by the rotating movements of the first rolling member 25a and the second rolling member 25b relative to the first wall 57a, e.g., the upper wall, of the first supporting member 22.

Figure 16:
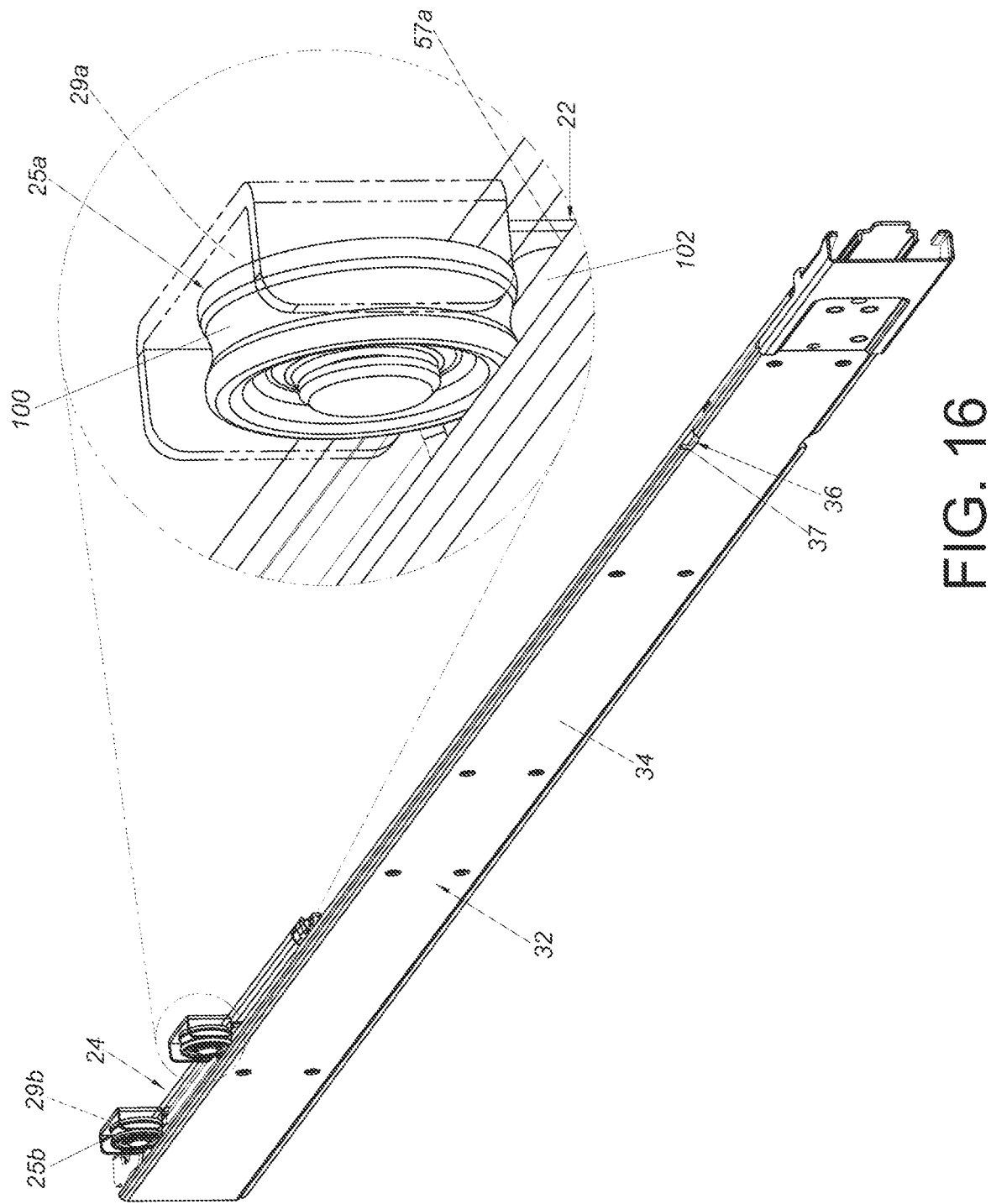
FIG. 16 is a diagram illustrating that at least one rolling member and a first supporting member of the slide rail mechanism respectively have cooperating features configured to cooperate with each other according to the embodiment of the present invention.

As shown in FIG. 16, the first supporting member 22 and each of the first rolling member 25a and the second rolling member 25b have two cooperating features configured to cooperate with each other. Furthermore, one of the first supporting member 22 and each of the first rolling member 25a and the second rolling member 25b includes a first cooperating feature 100, and the other one of the first supporting member 22 and each of the first rolling member 25a and the second rolling member 25b includes a second cooperating feature 102 configured to cooperate with the first cooperating feature 100. In this embodiment, by way of example, each of the first rolling member 25a and the second rolling member 25b can include the first cooperating feature 100, and the first supporting member 22 can include the second cooperating feature 102.

Specifically, the first cooperating feature 100 can be a groove structure, and the second cooperating feature 102 can be a protruding edge extending along g the longitudinal direction configured to abut against the groove structure for enhancing stability and reliability of the rotating movements of the first rolling member 25a and the second rolling member 25b relative to the first wall 57a of the first supporting member along the longitudinal direction.

From the above, the slide rail assembly 24 includes the following characteristics.

1. The configuration of at least one rolling member, e.g., the first rolling member 25a and/or the second rolling member 25b, arranged on the first rail 26 of the slide rail assembly 24 can reduce the friction forces resisting the displacements of the first rail 26 or the slide rail assembly 24 relative to the first supporting member 22 along the first predetermined direction D1 and the second predetermined direction D2.

2. The second rail 28 can synchronously displace together with the first rail 26 along the first predetermined direction D1, and/or the third rail 30 can synchronously displace together with the second rail 28 along the first predetermined direction D1.

3. The at least one rolling member, e.g., the first rolling member 25a and/or the second rolling member 25b, and the first supporting member 22 respectively include the first cooperating feature 100 and the second cooperating feature 102 configured to cooperate with the first cooperating feature 100 for enhancing stability and reliability of the rotating movements of the first rolling member 25a and the second rolling member 25b relative to the first supporting member 22 along the longitudinal direction.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail mechanism comprising:
  a first supporting member;
  a slide rail assembly, a length of the slide rail assembly being different from a length of the first supporting member, the slide rail assembly comprising a first rail, a second rail and a third rail, the first rail being an outer rail, the second rail being a middle rail, and the third rail being an inner rail;
  at least one rolling member, the first rail and the first supporting member being displaceable relative to each other by the at least one rolling member; and
  a second supporting member connected to the first supporting member, and the second supporting member comprising a disengaging feature.

2. The slide rail mechanism of claim 1, wherein the at least one rolling member is arranged on one of the first rail and the first supporting member.

3. The slide rail mechanism of claim 1, wherein the length of the slide rail assembly is less than the length of the first supporting member.

4. The slide rail mechanism of claim 1, wherein the second rail and the first rail displace synchronously during a displacement of the second rail away from a first predetermined position along a first predetermined direction, and the disengaging feature of the second supporting member is configured to terminate a displacement synchronization between the second rail and the first rail when the second rail and the first rail are synchronously displaced to a second predetermined position along the first predetermined direction.

5. The slide rail mechanism of claim 4, wherein the slide rail assembly further comprises a first auxiliary member and a second auxiliary member, the first auxiliary member is arranged on the first rail, the second auxiliary member is arranged on the second rail, and the second rail and the first rail displace synchronously by an abutment of the first auxiliary member and the second auxiliary member during the displacement of the second rail away from the first predetermined position along the first predetermined direction.

6. The slide rail mechanism of claim 5, wherein the first rail comprises a first side and a second side opposite to the first side, the slide rail assembly further comprises a resilient member arranged on the first side of the first rail and located between the first supporting member and the first rail, one of the first auxiliary member and the second auxiliary member is movable, and the one of the first auxiliary member and the second auxiliary member is configured to move to a first state for abutting against another one of the first auxiliary member and the second auxiliary member in response to a resilient force provided by the resilient member.

7. The slide rail mechanism of claim 6, wherein the disengaging feature of the second supporting member is configured to release the resilient member to drive the one of the first auxiliary member and the second auxiliary member from the first state to a second state so as to disengage the one of the first auxiliary member and the second auxiliary member from the another one of the first auxiliary member and the second auxiliary member for terminating the displacement synchronization between the second rail and the first rail when the second rail is displaced to the second predetermined position, the disengaging feature of the second supporting member is formed by excavating and configured to provide a moving space for the one of the first auxiliary member and the second auxiliary member, and the second supporting member further comprises a blocking feature located adjacent to the disengaging feature and configured to block the first rail for preventing the first rail from displacing away from the second predetermined position along a second predetermined direction opposite to the first predetermined direction.

8. The slide rail mechanism of claim 7, wherein the slide rail assembly further comprises a working member movably mounted on the second rail, a corresponding feature is arranged on the third rail, and the third rail drives the second rail to synchronously displace together with the third rail by an abutment of the corresponding feature and the working member during a displacement of the third rail along the first predetermined direction, the working member is pivotally connected to the second rail by a connecting member, and the working member is driven to a predetermined state for abutting against the corresponding feature in response to a resilient force provided by a resilient object.

9. The slide rail mechanism of claim 8, wherein a disengaging structure is arranged on the first rail, the disengaging structure is configured to terminate a displacement synchronization between the third rail and the second rail when the third rail and the second rail are synchronously displaced to a disengaging position along the first predetermined direction, a blocking structure is further arranged on the first rail and located adjacent to the disengaging structure, the blocking structure blocks the second rail for preventing the second rail from displacing away from a third predetermined position along the second predetermined direction when the second rail is displaced to the third predetermined position along the first predetermined direction.

10. A slide rail mechanism comprising:
a first supporting member comprising a first wall and a second wall;
a slide rail assembly comprising a first rail, a second rail and a third rail, the first rail and the first supporting member being displaceable relative to each other along a longitudinal direction, a disengaging structure being arranged on the first rail, the second rail and the first rail displacing synchronously during a displacement of the second rail away from a first predetermined position along a first predetermined direction, the third rail and the second rail synchronously displacing during a displacement of the third rail along the first predetermined direction, and the disengaging structure being configured to terminate a displacement synchronization between the third rail and the second rail;
a rolling member arranged on one of the first rail and the first supporting member and rotatably contacting with another one of the first rail and the first supporting member, so as to engage the first rail with the first wall of the first supporting member via the rolling member; and
a second supporting member connected to the first supporting member, the second supporting member comprising a disengaging feature, the disengaging feature of the second supporting member being configured to terminate a displacement synchronization between the second rail and the first rail when the second rail and the first rail are synchronously displaced to a second predetermined position along the first predetermined direction.

11. The slide rail mechanism of claim 10, wherein the first wall and the second wall of the first supporting member are an upper wall and a lower wall respectively, the rolling member comprises a first cooperating feature, and the first supporting member comprises a second cooperating feature configured to cooperate with the first cooperating feature.

12. The slide rail mechanism of claim 11, wherein a length of the first rail along the longitudinal direction is less than a length of the first supporting member along the longitudinal direction.

13. The slide rail mechanism of claim 10, wherein a blocking structure is further arranged on the first rail and located adjacent to the disengaging structure, the blocking structure blocks the second rail for preventing the second rail from displacing away from a third predetermined position along a second predetermined direction opposite to the first predetermined direction and the third rail is displaceable to a fourth predetermined position along the first predetermined direction when the second rail is displaced to the third predetermined position along the first predetermined direction, and the third rail is configured to terminate a blocking relation between the blocking structure and the second rail during a displacement of the third rail away from the fourth predetermined position along the second predetermined direction.

14. The slide rail mechanism of claim 13, wherein the second supporting member further comprises a blocking feature located adjacent to the disengaging feature and configured to block the first rail for preventing the first rail from displacing away from the second predetermined position along the second predetermined direction, and the second rail is configured to terminate a blocking relation between the blocking feature and the first rail during a displacement of the second rail away from the third predetermined position along the second predetermined direction.

15. The slide rail mechanism of claim 10, wherein the slide rail assembly further comprises a first auxiliary member and a second auxiliary member, the first auxiliary member is arranged on the first rail, the second auxiliary member is arranged on the second rail, and the second rail and the first rail displace synchronously by an abutment of the first auxiliary member and the second auxiliary member during the displacement of the second rail away from the first predetermined position along the first predetermined direction.

16. The slide rail mechanism of claim 15, wherein the slide rail assembly further comprises a resilient member, one of the first auxiliary member and the second auxiliary member is movable, and the one of the first auxiliary member and the second auxiliary member is configured to move to a first state for abutting against another one of the first auxiliary member and the second auxiliary member in response to a resilient force provided by the resilient member.

17. The slide rail mechanism of claim 16, wherein the disengaging feature of the second supporting member is configured to release the resilient member to drive the one of the first auxiliary member and the second auxiliary member from the first state to a second state so as to disengage the one of the first auxiliary member and the second auxiliary member from the another one of the first auxiliary member and the second auxiliary member for terminating the displacement synchronization between the second rail and the first rail when the second rail is displaced to the second predetermined position.

18. The slide rail mechanism of claim 10, wherein the slide rail assembly further comprises a working member movably mounted on the second rail, a corresponding feature is arranged on the third rail, and the third rail drives the second rail to synchronously displace together with the third rail by an abutment of the corresponding feature and the working member during the displacement of the third rail along the first predetermined direction, the working member is pivotally connected to the second rail by a connecting member, and the working member is driven to a predetermined state for abutting against the corresponding feature in response to a resilient force provided by a resilient object.

* * * * *